(12) United States Patent
Chiu et al.

(10) Patent No.: US 10,276,679 B2
(45) Date of Patent: Apr. 30, 2019

(54) SEMICONDUCTOR DEVICE AND METHOD FOR MANUFACTURING THE SAME

(71) Applicant: Vanguard International Semiconductor Corporation, Hsinchu (TW)

(72) Inventors: Chien-Wei Chiu, Beigang Township, Yunlin County (TW); Hsing-Chao Liu, Jhudong Township, Hsinchu County (TW); Chun-Fu Liu, Jhudong Township, Hsinchu County (TW); Ying-Kai Chou, Puzih (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/608,496

(22) Filed: May 30, 2017

(65) Prior Publication Data

US 2018/0350931 A1  Dec. 6, 2018

(51) Int. Cl.
   *H01L 29/423*  (2006.01)
   *H01L 29/78*   (2006.01)
   *H01L 29/40*   (2006.01)
   *H01L 21/28*   (2006.01)
   *H01L 29/66*   (2006.01)

(52) U.S. Cl.
   CPC .. *H01L 29/42368* (2013.01); *H01L 21/28158* (2013.01); *H01L 29/401* (2013.01); *H01L 29/66477* (2013.01); *H01L 29/78* (2013.01)

(58) Field of Classification Search
   CPC ......... H01L 29/42368; H01L 29/66477; H01L 21/28158; H01L 29/78; H01L 29/401
   See application file for complete search history.

(56) References Cited

U.S. PATENT DOCUMENTS

| | | | | |
|---|---|---|---|---|
| 3,339,128 A | * | 8/1967 | Kuznetzoff | H01L 29/00 257/365 |
| 3,719,866 A | * | 3/1973 | Naber | H01L 29/792 257/326 |
| 3,786,319 A | * | 1/1974 | Tomisaburo | H01L 23/485 257/365 |
| 3,855,610 A | * | 12/1974 | Masuda | H01L 27/088 148/DIG. 49 |

(Continued)

FOREIGN PATENT DOCUMENTS

| | | | | |
|---|---|---|---|---|
| JP | 53135581 A | * | 11/1978 | |
| JP | 04208573 A | * | 7/1992 | |
| KR | 20060068038 A | * | 6/2006 | |

*Primary Examiner* — Earl N Taylor
(74) *Attorney, Agent, or Firm* — Birch, Stewart, Kolasch & Birch, LLP

(57) ABSTRACT

A semiconductor device including a substrate, a first doped region, a second doped region, a gate, and a gate dielectric layer is provided. The substrate has a first conductive type. The first doped region is formed in the substrate and has a second conductive type. The second doped region is formed in the substrate and has the second conductive type. The gate is formed on the substrate and is disposed between the first and second doped regions. The gate dielectric layer is formed on the substrate and is disposed between the gate and the substrate. The gate dielectric layer includes a first region and a second region. The depth of the first region is different from the depth of the second region.

8 Claims, 3 Drawing Sheets

(56) References Cited

U.S. PATENT DOCUMENTS

| | | | | |
|---|---|---|---|---|
| 4,236,167 A * | 11/1980 | Woods | H01L 29/1045 | 257/353 |
| 4,247,860 A * | 1/1981 | Tihanyi | H01L 29/105 | 257/404 |
| 4,318,216 A * | 3/1982 | Hsu | H01L 29/7835 | 257/346 |
| 5,314,834 A * | 5/1994 | Mazure | H01L 29/42368 | 257/324 |
| 5,486,484 A * | 1/1996 | Malhi | H01L 27/0605 | 257/E27.012 |
| 5,592,002 A * | 1/1997 | Kanamori | H01L 29/42324 | 257/316 |
| 5,610,430 A * | 3/1997 | Yamashita | H01L 21/26506 | 257/412 |
| 5,679,968 A * | 10/1997 | Smayling | H01L 29/0847 | 257/213 |
| 5,741,737 A * | 4/1998 | Kachelmeier | H01L 21/28167 | 257/E21.193 |
| 5,801,416 A * | 9/1998 | Choi | H01L 21/28185 | 257/335 |
| 5,897,354 A * | 4/1999 | Kachelmeier | H01L 29/42324 | 257/E21.422 |
| 5,981,984 A * | 11/1999 | Iwaana | H01L 29/7455 | 257/138 |
| 6,054,728 A * | 4/2000 | Harada | H01L 29/0692 | 257/133 |
| 6,078,082 A * | 6/2000 | Bulucea | H01L 21/823807 | 257/345 |
| 6,078,086 A * | 6/2000 | Park | H01L 21/26586 | 257/386 |
| 6,124,153 A * | 9/2000 | Lee | H01L 29/42364 | 148/DIG. 163 |
| 6,136,674 A * | 10/2000 | An | H01L 21/26506 | 438/585 |
| 6,160,289 A * | 12/2000 | Kwon | H01L 29/7833 | 257/335 |
| 6,207,485 B1 * | 3/2001 | Gardner | H01L 21/28185 | 257/E21.434 |
| RE37,199 E * | 5/2001 | Yamauchi | G11C 16/0425 | 438/264 |
| 6,225,669 B1 * | 5/2001 | Long | H01L 21/28105 | 257/221 |
| 6,271,572 B1 * | 8/2001 | Fujita | H01L 21/8234 | 257/392 |
| 6,333,234 B1 * | 12/2001 | Liu | H01L 29/78612 | 257/E29.278 |
| 6,399,468 B2 * | 6/2002 | Nishibe | H01L 29/6659 | 257/E21.417 |
| 6,441,431 B1 * | 8/2002 | Efland | H01L 29/086 | 257/335 |
| 6,642,581 B2 * | 11/2003 | Matsuda | H01L 21/266 | 257/327 |
| 6,709,934 B2 * | 3/2004 | Lee | H01L 21/28194 | 257/206 |
| 6,869,891 B2 * | 3/2005 | Son | H01L 21/26506 | 438/766 |
| 6,884,703 B2 * | 4/2005 | Arnborg | H01L 21/2822 | 257/E29.133 |
| 6,911,694 B2 * | 6/2005 | Negoro | H01L 21/823857 | 257/333 |
| 6,933,554 B1 * | 8/2005 | Han | H01L 21/28194 | 257/314 |
| 7,038,274 B2 * | 5/2006 | You | H01L 21/823814 | 257/335 |
| 7,074,659 B2 * | 7/2006 | Zuniga | H01L 21/823807 | 257/E21.633 |
| 7,727,844 B2 * | 6/2010 | Kim | H01L 29/6659 | 438/294 |
| 7,888,222 B2 * | 2/2011 | You | H01L 29/7833 | 257/E21.417 |
| 8,283,751 B2 * | 10/2012 | Kurjanowicz | G11C 17/16 | 257/288 |
| 8,354,717 B2 * | 1/2013 | You | H01L 29/7833 | 257/328 |
| 8,431,450 B1 * | 4/2013 | Zuniga | H01L 29/0634 | 257/328 |
| 8,461,647 B2 * | 6/2013 | Chou | H01L 29/7835 | 257/335 |
| 8,936,980 B1 * | 1/2015 | Zuniga | H01L 29/402 | 438/197 |
| 9,299,773 B2 * | 3/2016 | Chan | H01L 29/66681 | |
| 2002/0048970 A1 * | 4/2002 | Feudel | H01L 21/02238 | 438/787 |
| 2003/0141559 A1 * | 7/2003 | Moscatelli | H01L 21/28167 | 257/406 |
| 2003/0143791 A1 * | 7/2003 | Cheong | H01L 21/28114 | 438/197 |
| 2003/0235990 A1 * | 12/2003 | Wu | H01L 21/28061 | 438/694 |
| 2004/0238913 A1 * | 12/2004 | Kwon | H01L 27/088 | 257/492 |
| 2005/0006701 A1 * | 1/2005 | Sung | H01L 21/823814 | 257/339 |
| 2005/0073007 A1 * | 4/2005 | Chen | H01L 29/1083 | 257/355 |
| 2005/0106791 A1 * | 5/2005 | You | H01L 21/823814 | 438/197 |
| 2005/0106825 A1 * | 5/2005 | You | H01L 21/823814 | 438/301 |
| 2005/0205923 A1 * | 9/2005 | Han | H01L 21/28273 | 257/315 |
| 2006/0022281 A1 * | 2/2006 | Yamazaki | H01L 21/823418 | 257/392 |
| 2007/0158761 A1 * | 7/2007 | Kim | H01L 29/6659 | 257/389 |
| 2008/0246098 A1 * | 10/2008 | Kurjanowicz | G11C 17/16 | 257/408 |
| 2008/0265292 A1 * | 10/2008 | Huang | H01L 29/1083 | 257/288 |
| 2009/0072308 A1 * | 3/2009 | Chen | H01L 29/42368 | 257/336 |
| 2009/0108347 A1 * | 4/2009 | Adkisson | H01L 29/42368 | 257/339 |
| 2009/0159990 A1 * | 6/2009 | Park | H01L 29/42368 | 257/408 |
| 2011/0079860 A1 * | 4/2011 | Verhulst | B82Y 10/00 | 257/402 |
| 2011/0220995 A1 * | 9/2011 | Chou | H01L 29/42368 | 257/335 |
| 2012/0228705 A1 * | 9/2012 | Toh | H01L 29/42368 | 257/339 |
| 2013/0168770 A1 * | 7/2013 | Jeon | H01L 29/7869 | 257/347 |
| 2017/0263766 A1 * | 9/2017 | Xia | H01L 29/1095 | |

* cited by examiner

SEMICONDUCTOR DEVICE AND METHOD FOR MANUFACTURING THE SAME

BACKGROUND OF THE INVENTION

Field of the Invention

The invention relates to a semiconductor device, and more particularly to a semiconductor device comprising a gate dielectric layer comprising a first region and a second region, wherein the depth of the first region is different from the depth of the second region.

Description of the Related Art

The semiconductor integrated circuit (IC) industry has developed rapidly during the past decades. As semiconductor devices continue to be scaled down to smaller sizes following Moore's law, the operation speed and processing technique of the devices are continuously being improved. In addition, in order to achieve a more diverse and high-performance design, the need for applying high-voltage elements to the electronic products is gradually being increased. In the manufacturing processes of high-voltage elements, the semiconductor integrated circuit industry has constantly improved in terms of the design of materials and manufacturing processes, so as to shrink the size of the devices, to reduce the cost, and to provide the best performance by the components.

Although existing semiconductor devices and methods for forming the same have been adequate for their intended purposes, they have not been entirely satisfactory in all respects. Therefore, there are still some problems to be overcome in regards to semiconductor integrated circuits and technology.

BRIEF SUMMARY OF THE INVENTION

In accordance with an embodiment, a semiconductor device comprises a substrate, a first doped region, a second doped region, a gate, and a gate dielectric layer. The substrate has a first conductive type. The first doped region is formed in the substrate and has a second conductive type. The second doped region is formed in the substrate and has the second conductive type. The gate is formed on the substrate and is disposed between the first and second doped regions. The gate dielectric layer is formed on the substrate and is disposed between the gate and the substrate. The gate dielectric layer comprises a first region and a second region. The depth of the first region is different from the depth of the second region.

An exemplary embodiment of a method for manufacturing a semiconductor device is described in the following. A substrate having a first conductive type is provided. A first doped region is formed in the substrate. The first doped region has a second conductive type. A second doped region is formed in the substrate. The second doped region has the second conductive type. A gate is formed on the substrate. The gate is disposed between the first and second doped regions. A gate dielectric layer is formed on the substrate. The gate dielectric layer is disposed between the gate and the substrate and comprises a first region and a second region. The depth of the first region is different from the depth of the second region.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
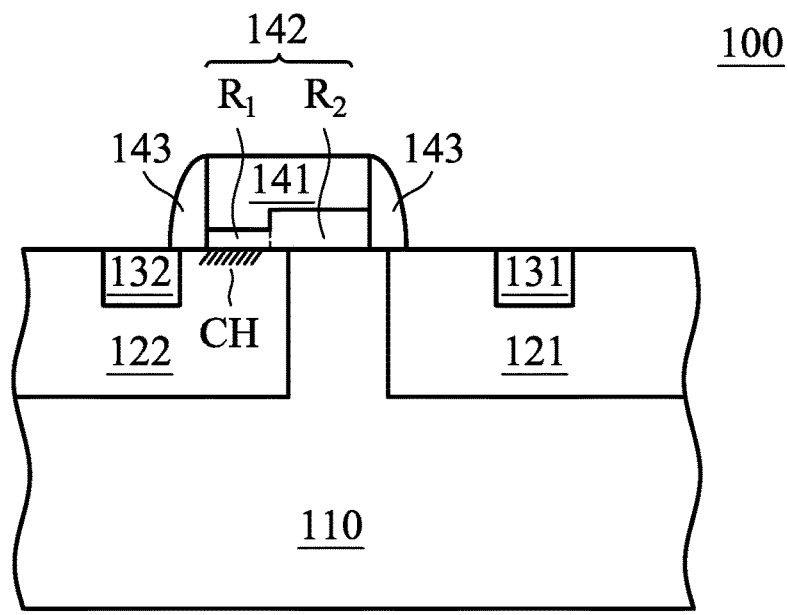
FIG. 1 is a cross-sectional view of a semiconductor device in accordance with some embodiments of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate not only that the layer directly contacts the other layer, but also that the layer does not directly contact the other layer, there being one or more intermediate layers disposed between the layer and the other layer.

FIG. 1 is a cross-sectional view of a semiconductor device in accordance with some embodiments of the present disclosure. As shown in FIG. 1, the semiconductor device 100 comprises a substrate 110, doped regions 131 and 132, a gate 141, and a gate dielectric layer 142. The substrate 110 may include, but is not limited to, semiconductor substrate such as a silicon substrate. In addition, the substrate 1010 may include an element semiconductor which may include germanium; compound semiconductor which may include silicon carbide, gallium arsenide, gallium phosphide, indium phosphide, indium arsenide and/or indium antimonide, alloy semiconductor which may include SiGe alloy, GaAsP alloy, AlInAs alloy, AlGaAs alloy, GaInAs alloy, GaInP alloy and/or GaInAsP alloy, or a combination thereof. In addition, the substrate 110 may include semiconductor-on-insulator. In one embodiment, the substrate 110 may be an un-doped substrate. However, in other embodiments, the substrate 110 may be a lightly doped substrate such as a lightly doped P-type substrate or a lightly doped N-type substrate. In this embodiment, the substrate 110 has a first conductive type.

The doped regions 131 and 132 are formed in the substrate 110. Each of the doped regions 131 and 132 has the second conductive type. In one embodiment, the doped regions 131 and 132 may be formed by doping N-type dopants such as phosphorus, arsenic, nitrogen, antimony, or combinations thereof In this embodiment, the doped regions 131 and 132 are N$^+$-type doped regions. In another embodiment, the doped regions 131 and 132 may be formed by doping P-type dopants such as boron, gallium, aluminum, indium, or combinations thereof. In this embodiment, the doped regions 131 and 132 are P$^+$-type doped regions. In this embodiment, the second conductive type is different from the first conductive type. In one embodiment, the first conductive type is P-type, and the second conductive type is N-type. In another embodiment, the first conductive type is N-type, and the second conductive type is P-type.

The gate 141 is formed on the substrate 110 and between the doped regions 131 and 132. In one embodiment, the gate 141, the doped region 131, and the doped region 132 constitute a transistor. In such case, the gate 141 is electrically connected to a gate electrode, the doped region 131 is electrically connected to a drain electrode, and the doped region 132 electrically connected to a source electrode. The transistor may be turned on or off according to the voltage levels of the gate electrode, the drain electrode, and the source electrode. In this embodiment, the distance between the doped region 131 and gate 141 is different from the distance between the doped region 132 and the gate 141. Therefore, the semiconductor device has an asymmetric structure, such as a laterally diffused metal oxide semiconductor (LDMOS).

The gate dielectric layer 142 is formed on the substrate 110 and between the gate 141 and the substrate 110. In one embodiment, In one embodiment, a dielectric material layer (not shown, for forming the gate dielectric layer 142) and a conductive material layer (not shown, for forming the gate 141) thereon may be blanketly deposited over substrate 110 sequentially. Subsequently, the gate dielectric layer 142 and the gate 141 are respectively formed from the dielectric material layer and the conductive material layer by patterning the above two layers through another photolithography and etch steps.

The material of the dielectric material layer (i.e. the material of the gate dielectric layer 142) may include, but is not limited to, silicon oxide, silicon nitride, silicon oxynitride, high-k material, any other suitable dielectric material, or a combination thereof. The high-k material may include, but is not limited to, metal oxide, metal nitride, metal silicide, transition metal oxide, transition metal nitride, transition metal silicide, transition metal oxynitride, metal aluminate, zirconium silicate, zirconium aluminate. For example, the material of the high-k material may include, but is not limited to, LaO, AlO, ZrO, TiO, $Ta_2O_5$, $Y_2O_3$, $SrTiO_3$(STO), $BaTiO_3$(BTO), BaZrO, $HfO_2$, $HfO_3$, HfZrO, HfLaO, HfSiO, HfSiON, LaSiO, AlSiO, HfTaO, HfTiO, HfTaTiO, HfAlON, (Ba,Sr)$TiO_3$(BST), $Al_2O_3$, $SiO_2$, any other suitable high-k dielectric material, or a combination thereof. The dielectric material layer may be formed by the previously described chemical vapour deposition (CVD) or spin-on coating.

The material of the conductive material layer (i.e. the material of the gate 141) may include, but is not limited to, amorphous silicon, poly-silicon, one or more metal, metal nitride, conductive metal oxide, or a combination thereof. The metal may include, but is not limited to, molybdenum, tungsten, titanium, tantalum, platinum, or hafnium. The metal nitride may include, but is not limited to, molybdenum nitride, tungsten nitride, titanium nitride or tantalum nitride. The conductive metal oxide may include, but is not limited to, ruthenium oxide or indium tin oxide. The conductive material layer may be formed by the previous described chemical vapour deposition (CVD), sputtering, resistive thermal evaporation, electron beam evaporation, or any other suitable methods. For example, in one embodiment, the amorphous silicon conductive material layer or poly-silicon conductive material layer may be deposited and formed by low-pressure chemical vapor deposition (LP-CVD) at about 525° C.~650° C. The thickness of the amorphous silicon conductive material layer or poly-silicon conductive material layer may range from about 1000 Å to 10000 Å.

As shown in FIG. 1, the gate dielectric layer 142 comprises regions $R_1$ and $R_2$. The depth of the region $R_1$ is different from the depth of the region $R_2$. In this embodiment, the depth of the region $R_1$ is less than the depth of the region $R_2$. When the voltage between the gate 141 and the doped region 132 arrives a threshold voltage, a channel CH is formed under the regions $R_1$ such that the transistor constituted by the gate 141, the doped region 131, and the doped region 132 is turned on. Since the depth of the region $R_1$ is thin, the speed of switching from a turned-on state to a turned-off state or from a turned-off state to a turned on state is fast. In addition, since the depth of the region $R_2$ is thicker than the depth of the region $R_1$, when the transistor is turned off, no current leakage occurs in the transistor.

In this embodiment, the semiconductor device 100 further comprises an insulating sidewall layer 143. The insulating sidewall layer 143 is formed over the sidewalls of the gate 141 and the gate dielectric layer 142. In some embodiments, an insulating layer, for example silicon oxide or silicon nitride, with a thickness ranging from about 200 Å to 2000 Å may be deposited by low-pressure chemical vapor deposition or plasma-enhanced chemical vapour deposition at about 350° C.~850° C. Alternatively, when the insulating sidewall layer 143 is a composite sidewall layer, more than one insulating layer may be deposited. After the deposition, $SF_6$, $CF_4$, $CHF_3$ or $C_2F_6$ are used as an etchant and an anisotropic etching is performed by a reactive ion etching step to form the insulating sidewall layer 114 over the sidewalls of the gate 141 and the gate dielectric layer 142

In other embodiments, the semiconductor device 100 further comprises a well 121. The well 121 is formed in the substrate 110 and has the second conductive type. For example, when the second conductive type is N-type, the predetermined region for the well 121 may be implanted with phosphorous ions or arsenic ions to form the well 121. However, when the second conductive type is P-type, the predetermined region for the well 121 may be implanted with boron ion or indium ions to form the well 121. In this embodiment, the doped region 131 is disposed in the well 121. In one embodiment, the dopant concentration of the doped region 131 is higher than the dopant concentration of the well 121. Furthermore, the doped region 131 is spaced apart from the gate dielectric layer 142.

In another embodiment, the semiconductor device 100 further comprises a well 122. The well 122 is formed in the substrate 110 and has the first conductive type. In one embodiment, the well 122 may be formed by ion-implanted processes. For example, when the first conductive type is N-type, the predetermined region for the well 122 may be implanted with phosphorous ions or arsenic ions to form the well 122. However, when the first conductive type is P-type, the predetermined region for the well 122 may be implanted with boron ion or indium ions to form the well 122. In one embodiment, the dopant concentration of the well 122 is higher than the dopant concentration of the substrate 110. In this embodiment, the doped region 132 is disposed in the well 122. As shown in FIG. 1, the gate dielectric layer 142 overlaps a portion of the well 122.

Figure 2:
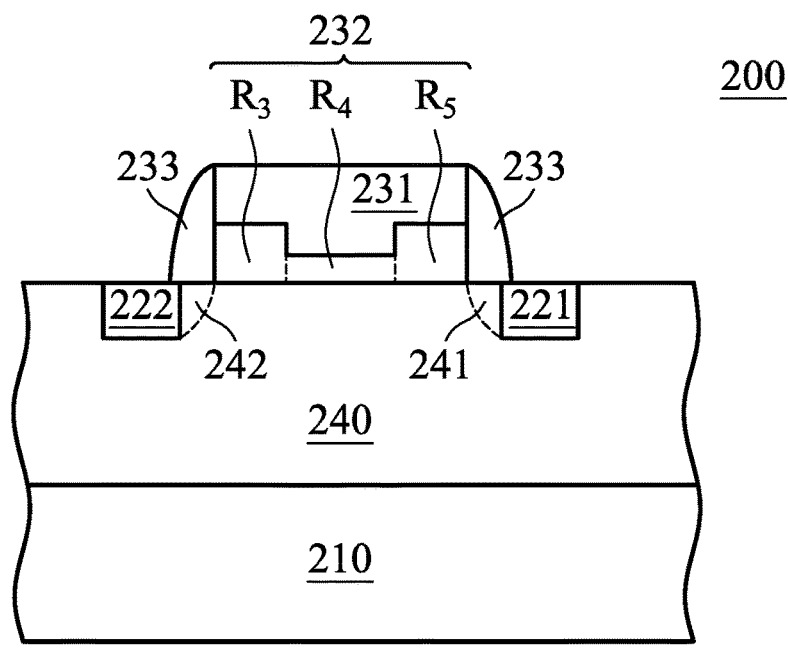
FIG. 2 is a cross-sectional view of a semiconductor device in accordance with another embodiment of the present disclosure.

FIG. 2 is a cross-sectional view of a semiconductor device in accordance with another embodiment of the present disclosure. The semiconductor device 200 comprises a substrate 210, doped regions 221 and 222, a gate 231, and a gate dielectric layer 232. The substrate 210 has a first conductive type. Since the formation of the substrate 210 is the same as the formation of the substrate 110 shown in FIG. 1, the description of the substrate 210 is omitted.

Each of the doped regions 221 and 222 has a second conductive type and formed in the substrate 210. Since the formation of the doped region 221 is the same as the formation of the doped region 131 and the formation of the doped region 222 is the same as the formation of the doped region 132, the descriptions of the doped regions 221 and 222 are omitted. The gate 231 is formed on the substrate 210 and between the doped regions 221 and 222. The gate dielectric layer 232 is disposed between the gate 231 and the substrate 210. The formation of the gate 231 is the same as the formation of the gate 141 such that the description of the gate 231 is omitted. Furthermore, since the formation of the gate dielectric layer 232 is the same as the formation of the gate dielectric layer 142, the description of the gate dielectric layer 232 is omitted.

In this embodiment, the gate dielectric layer 232 comprises regions $R_3$~$R_5$. The region $R_4$ is disposed between the regions $R_3$ and $R_5$. The depth of the region $R_3$ is the same as the depth of the region $R_5$. However, the depth of the region $R_3$ is different from the depth of the region $R_4$. As shown in FIG. 2, the depth of the region $R_3$ is greater than the depth of the region $R_4$.

In some embodiment, the semiconductor device 200 further comprises a well 240. The well 240 is formed in the substrate 210 and has the first conductive type. In one embodiment, the dopant concentration of the well 240 is lower than the dopant concentration of the substrate 210. Since the formation of the well 240 is the same as the well 122 shown in FIG. 1, the description of the well 240 is omitted. In this embodiment, the doped regions 221 and 222 are formed in the well 240.

In another embodiment, the semiconductor device 200 further comprises lightly doped drains (LDDs) 241 and 242. In this embodiment, each of the LDDs 241 and 242 has the second conductive type. As shown in FIG. 2, the LDD 241 directly contacts the doped region 221. The LDD 242 directly contacts the doped region 222. The LDDs 241 and 242 are configured to avoid hot carrier effect.

In other embodiments, the semiconductor device 200 further comprises an insulating sidewall layer 233. The insulating sidewall layer 233 is formed over the sidewalls of the gate 231 and the gate dielectric layer 232. Since the formation of the insulating sidewall layer 233 is the same as the formation of the insulating sidewall layer 143 shown in FIG. 1, the description of the insulating sidewall layer 233 is omitted. In this embodiment, the insulating sidewall layer 233 covers the LDDs 241 and 242.

Figure 3A:
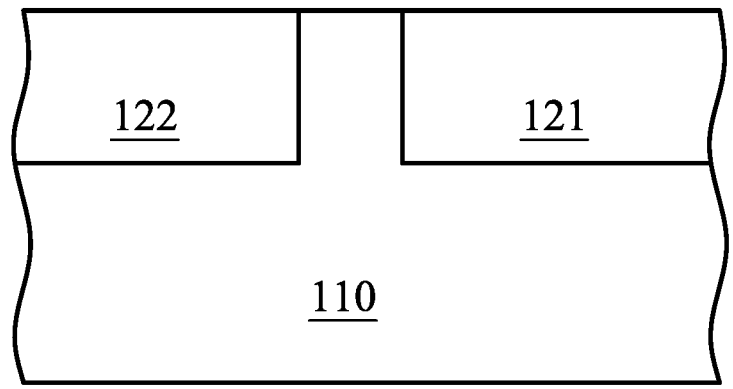
FIGS. 3A~3C are cross-sectional views of the semiconductor device 100 at various manufacturing stages in accordance with some embodiments of the present disclosure.
Figure 3B:
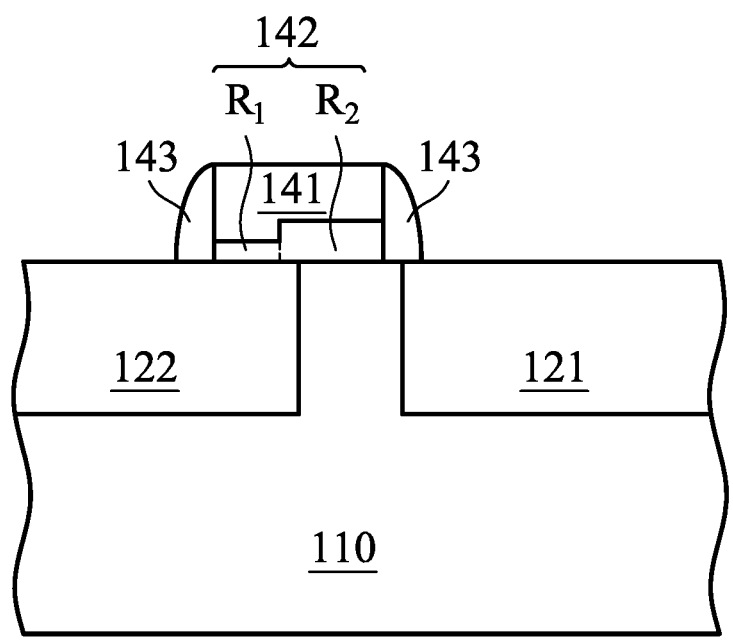
Figure 3C:
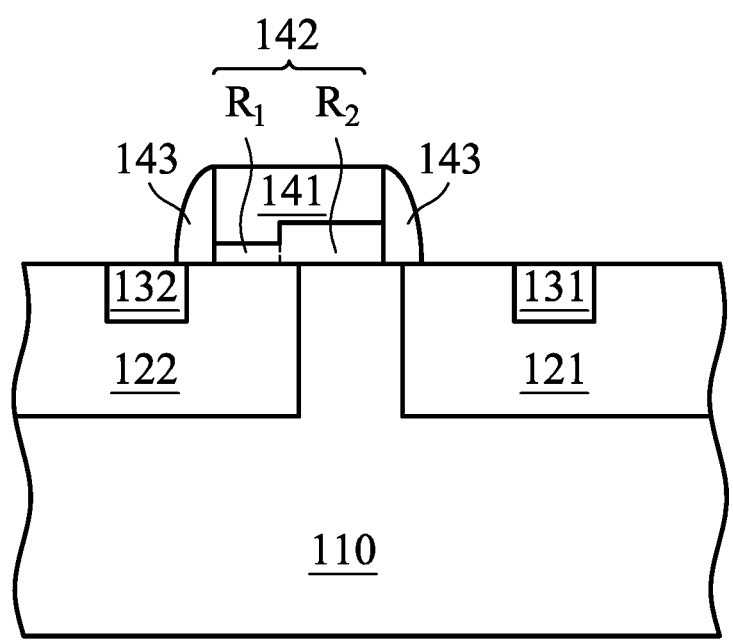

FIGS. 3A~3C are cross-sectional views of the semiconductor device 100 at various manufacturing stages in accordance with some embodiments of the present disclosure. Referring to FIG. 3A, a substrate 110 is provided first. In one embodiment, the substrate 110 has a first conductive type. Next, wells 121 and 122 are formed in the substrate 110. In one embodiment, the well 121 has a second conductive type, and the well 122 has the first conductive type. The first conductive type is different from the second conductive type. In other embodiment, the dopant concentration of the well 122 is higher than the dopant concentration of the substrate 110.

Referring to FIG. 3B, a gate dielectric layer 142 and a gate are sequentially formed on the substrate 110. In one embodiment, a dielectric material layer (not shown, for forming the gate dielectric layer 142) and a conductive material layer (not shown, for forming the gate 141) thereon may be blanketly deposited over the substrate 110 sequentially. Then the predetermined regions of the doped regions 131 and 132 are exposed from the dielectric material layer and the conductive material layer through photolithography and etch steps. Subsequently, the gate dielectric layer 142 and the gate 141 are respectively formed from the dielectric material layer and the conductive material layer by patterning the above two layers through another photolithography and etch steps. In this embodiment, the gate dielectric layer 142 is divided into regions $R_1$ and $R_2$. The depth of the region $R_1$ is less than the depth of the region $R_2$.

Next, referring to FIG. 3C, an insulating sidewall layer 143 is formed over the sidewalls of the gate dielectric layer 142 and the gate 141. After the insulating sidewall layer 143, the doped regions 131 and 132 may be formed by ion implantation. The doped regions 131 and 132 are disposed in the substrate 110 at opposite sides of the gate 141 respectively. In one embodiment, the doped region 131 is disposed in the well 121 and has the second conductive type. The doped region 132 is disposed in the well 122 and has the second conductive type. As shown in FIG. 3C, the doped region 132 and the gate dielectric layer 142 are separated from each other. In one embodiment, each of the dopant concentrations of the doped regions 131 and 132 is higher than the dopant concentration of the well 121. In other embodiments, the gate 141, the doped region 131 and the doped region 132 constitute a transistor.

Since the depth of the region $R_1$ is less than the depth of the region $R_2$, when the transistor is switched from a turned-on state to a turned-off state or from a turned-off state to a turned-on state, the switching time of the transistor is reduced. Additionally, since the depth of the region $R_2$ is higher than the depth of the region $R_1$, when the transistor is turned off, no current leakage occurs in the transistor.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A semiconductor device, comprising:
   a substrate having a first conductive type;
   a well formed in the substrate and having the first conductive type, wherein a dopant concentration of the well is lower than a dopant concentration of the substrate;
   a first doped region formed in the well and having a second conductive type;
   a second doped region formed in the well and having the second conductive type;
   a gate formed on the well and disposed between the first and second doped regions;
   a gate dielectric layer formed on the well and disposed between the gate and the substrate, wherein the gate dielectric layer comprises:
   a first region;
   a second region, wherein the depth of the first region is different from the depth of the second region; and
   a third region, wherein the depth of the third region is the same as the depth of the first region, and the second region is disposed between the first and third regions;

a first insulating sidewall layer forming over a first sidewall of the gate and a first sidewall of the gate dielectric layer;

a second insulating sidewall layer forming over a second sidewall of the gate and a second sidewall of the gate dielectric layer;

a first lightly doped drain forming in the well and having the second conductive type, wherein first lightly doped drain directly contacts the first doped region and the first insulating sidewall layer; and a second lightly doped drain forming in the well and having the second conductive type, wherein second lightly doped drain directly contacts the second doped region and the second insulating sidewall layer, wherein the second doped region does not contact the gate dielectric layer, and wherein the first and second doped regions directly contact the well.

2. The semiconductor device as claimed in claim 1, wherein the first doped region, the second doped region, and the gate constitute a transistor.

3. The semiconductor device as claimed in claim 1, wherein the first conductive type is P-type, and the second conductive type is N-type.

4. The semiconductor device as claimed in claim 1, wherein the first conductive type is N-type, and the second conductive type is P-type.

5. A method for manufacturing a semiconductor device, comprising:

providing a substrate having a first conductive type;

forming a well in the substrate, wherein the well has the first conductive type, and a dopant concentration of the well is lower than a dopant concentration of the substrate;

forming a first doped region in the well, wherein the first doped region has a second conductive type;

forming a second doped region in the well, wherein the second doped region has the second conductive type;

forming a gate on the well, wherein the gate is disposed between the first and second doped regions;

forming a gate dielectric layer on the well, wherein the gate dielectric layer is disposed between the gate and the substrate and comprises a first region, a second region, and a third region, wherein the second region is disposed between the first and third regions, a depth of the first region is different from a depth of the second region and a depth of the third region is the same as the depth of the first region;

forming a first insulating sidewall layer over a first sidewall of the gate and a first sidewall of the gate dielectric layer;

forming a second insulating sidewall layer over a second sidewall of the gate and a second sidewall of the gate dielectric layer;

forming a first lightly doped drain in the well, wherein the first lightly doped drain has the second conductive type and directly contacts the first doped region and the first insulating sidewall layer; and forming a second lightly doped drain in the well, wherein the second lightly doped drain has the second conductive type and directly contacts the second doped region and the second insulating sidewall layer, wherein the second doped region does not contact the gate dielectric layer, and wherein the first and second doped regions directly contact the well.

6. The method as claimed in claim 5, wherein the first doped region, the second doped region, and the gate constitute a transistor.

7. The method as claimed in claim 5, wherein the first conductive type is P-type, and the second conductive type is N-type.

8. The method as claimed in claim 5, wherein the first conductive type is N-type, and the second conductive type is P-type.

* * * * *